United States Patent [19]

Schröter et al.

[11] 4,068,251
[45] Jan. 10, 1978

[54] DEVELOPING DEVICE FOR PRINTING PLATES

[75] Inventors: Herbert Schröter, Taunusstein; Alexander Planz, Daxweiler, both of Germany

[73] Assignee: Hoechst Aktiengesellschaft, Germany

[21] Appl. No.: 657,587

[22] Filed: Feb. 12, 1976

[30] Foreign Application Priority Data

Feb. 17, 1975 Germany ................. 7504728[U]

[51] Int. Cl.² .............................................. G03D 3/02
[52] U.S. Cl. ................................. 354/325; 101/463; 118/52; 354/317; 354/326
[58] Field of Search ............... 354/325, 326, 317, 319; 118/52; 101/463

[56] References Cited

U.S. PATENT DOCUMENTS

| 2,386,591 | 10/1945 | Campbell | 118/52 |
| 3,528,358 | 9/1970 | Pickard | 354/325 X |
| 3,682,078 | 8/1972 | Parker et al. | 354/319 X |

*Primary Examiner*—Richard L. Moses
*Attorney, Agent, or Firm*—James E. Bryan

[57] ABSTRACT

This invention relates to a developing device for printing plates comprising a developing chamber, rotatable printing plate support means in said chamber, spray nozzle means directed at said printing plate support means, vertically reciprocatable rotatable brush means mounted above said printing plate support means, means for supplying fluid to said spray nozzle means, and means for actuating said printing plate support means and said brush means.

4 Claims, 1 Drawing Figure

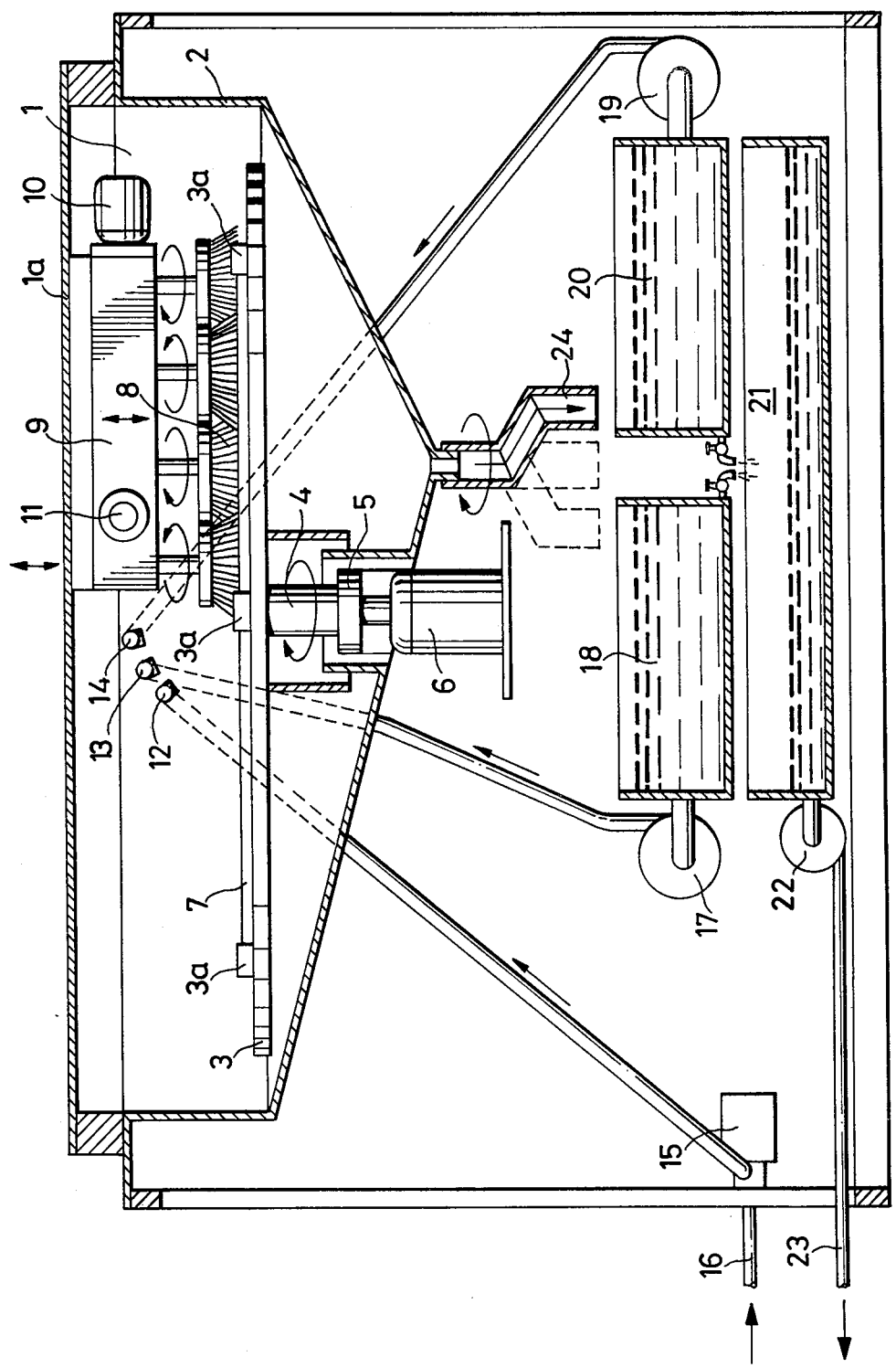

DEVELOPING DEVICE FOR PRINTING PLATES

This invention relates to a developing device for printing plates comprising a printing plate support which rotates in a developing chamber and on which a printing plate may be releasably clamped, and spray nozzles which are directed onto the surface of the printing plate.

It is the object of the present invention to allow several consecutive development steps to proceed rapidly in the developing chamber without requiring a large quantity of rinsing liquid.

In a known developing device of this type (German Offenlegungsschrift No. 1,522,506), the exposed printing plates are washed with a wash-out solution for development. Since the printing plate is treated only in the developing chamber with the wash-out solution, no difficulties can arise from the mixing of different liquids used for treating the surface of the printing plate in subsequent process steps. For the same reason, however, the use of this device is limited. The applicability of the device is still further limited by the fact that no means are provided for subjecting the surface of the printing plate to be developed to a more intensive mechanical treatment.

The latter provision also must be made for another known developing device (German Offenlegungsschrift No. 1,522,869) in which a printing plate releasably fixed in a closed container is sprayed, in consecutive developing steps with the solutions required for the various steps of the development process, from a spray tube which may be reciprocated along the printing plate. The lower portion of the container is in the form of a collecting vessel for collecting the different solutions used for the different developing steps. By way of a system of valves, the collecting vessel may be connected to any of several containers in which the sprayed liquid is collected for re-cycling. In this device, substantial quantities of the solutions sprayed during the different processing steps would mix with each other if the printing plate were not rinsed with an appropriate quantity of a rinsing liquid between individual developing steps. This is especially the case because the printing plate is mounted in the container in a horizontal position so that the solution adhering thereto flows or drips off only incompletely.

Other known devices in which the printing plate is treated with rotating brushes while developer liquid is supplied, allow a more intensive surface treatment of the printing plate during the development process. In one device of this type which is part of the prior art (German Offenlegungsschrift No. 1,772,512), the printing plate is passed beneath two rotating cylindrical dampening rollers in the developing chamber. In this device, the solutions cannot mix with each other in an undesirable manner because, within the developing chamber, the printing plate is treated with only one solution, whereas the other development steps are subsequently performed outside of the developing chamber. This means, however, that the entire developing apparatus requires more space.

It is the object of the present invention to provide a developing device of the type described in which a printing plate may be treated in consecutive developing steps with the respective solutions in a single developing chamber and in which, if desired, the printing plate may be subjected to an intensive mechanical surface treatment. It is possible for the solutions sprayed during the various developing steps to automatically and easily be separated practically completely from the printing plate and the devices used for treating it and to be collected, if it is desired to re-cycle the solutions. Further, as little rinsing liquid as possible is required in order to remove the solution supplied for one developing step from the developing chamber and especially from the printing plate and the device used for treating it, before introducing the solution to be sprayed during the next developing step.

The invention has the particular advantage that the solutions used for the individual developing steps may be substantially centrifuged between the individual developing steps from the printing plate and from the brushes used for an intensive surface treatment. Thus, the different solutions may be removed within a relatively short time without requiring a large amount of rinsing agent and may be collected for re-cycling, if desired. In order to centrifuge the solutions in the desired manner from the printing plate and the brushes, the brushes, which rest against the surface of the printing plate while the printing plate is being treated, are lifted from that surface. As soon as the printing plate and brushes are separated from each other, the speed of the rotating printing plate and of the rotating brushes is increased so that the solutions are rapidly and substantially completely flung off by centrifugal forces. By separating the brushes from the surface of the printing plate, damaging of the brushes and of the printing plate is reliably avoided. The printing plate support with the printing plate fixed thereto may be rotated, for example, at a speed of about 50 revolutions per minute as long as the brushes are in contact with the surface of the printing plate, whereas the number of revolutions is increased to about 400 revolutions per minute for centrifuging when the brushes are lifted. The number of revolutions of the lifted rotating brushes is also increased. Preferably, the speed of the brushes is higher than that of the printing plate support in each case.

For this purpose, it is advisable to connect the printing plate support with a speed-controlled electric motor and to connect the rotating brushes with a second speed-controlled electric motor. In this manner, the construction may be made relatively simple, because transmission elements for transmitting the rotary motion between the printing plate support and the rotating brushes can be dispensed with.

In an advantageous embodiment of the developing device according to the invention, the printing plate support is designed as a horizontally arranged turntable. On this turntable, the printing plate may be adjusted and fastened with particular ease. In view of the other characteristic features of the developing device according to the invention, the fact that a solution flows off less readily from a horizontal printing plate than it does from a vertical printing plate is of less significance and causes no difficulties. The solutions are practically completely removed by the centrifugal forces occurring at high rates of revolutions.

Advantageously, the rotating brushes are cup-shaped. Cup-shaped brushes are preferred because, under the action of high centrifugal forces, they fling droplets of the solution primarily in the direction of the side walls of the developing chamber so that wetting of the printing plate by droplets of the solution is diminished.

The developing chamber preferably should be closed, at least in the centrifugal range of the printing plate and the cup-shaped brushes, and may be designed as a lidded collecting vessel with a tapering bottom which opens into a knee pipe capable of being swiveled into a position over any of several tanks. In this manner, the solution flung off from the printing plate and the brushes flows into the pipe, which in each case is swiveled over the tank provided for the respective solution. The liquid collected in the tank may be re-cycled to the spray nozzles and used for developing the next printing plate.

The invention will now be described with reference to the accompanying drawing in which the developing device is shown in a longitudinal section.

In the drawing, numeral 1 designates a developing chamber formed by a collecting vessel 2 and a removable lid 1a which closes the collecting vessel. For supporting the printing plate, a turntable 3 is arranged in the developing chamber. The shaft 4 of the turntable 3 is supported in a flange 5 outside of the developing chamber. The turntable is driven by a speed-controlled electric motor 6. A printing plate 7 is clamped to the turntable by means of four plate holders 3a which are arranged around the circumference of the turntable, preferably at equal intervals and may be radially displaced on the table and fixed. (In the drawing, the fourth plate holder is hidden by the plate holder shown above the shaft 4 and thus is invisible.)

Further, the developing chamber contains cup-shaped brushes 8 whose front sides rest against the surface of the printing plate 7. The cup-shaped brushes 8 are pivoted in a gear case 9 which is fastened to the lid 1a. By means of the displaceable gear case 9, the cup-shaped brushes may be lowered onto the surface of the printing plate 7 - as shown in the drawing - or lifted therefrom. An electric motor 10 flanged to the gear case 9 is used for lifting and lowering the gear case. Further, a speed-controlled electric motor 11 is provided at the gear case which is connected with the cup-shaped brushes over driving elements housed in the gear case.

Spray nozzles 12, 13, and 14 directed onto the surface of the printing plate 7 open into the developing chamber. Spray nozzle 12 is connected, through a valve 15, with a water inlet 16. Spray nozzle 13 is connected with a developer tank 18 by means of a pump and spray nozzle 14 is connected, through a second pump 19, with a tank 20 for the fixing solution. The developer tank 18 and the tank 20 for the fixing solution are arranged above a drain tank 21, but do not completely cover it. A pump 22 flanged to the drain tank 21 leads to a drain pipe 23.

Above the tanks, a swiveling knee pipe 24 is arranged into which the tapering lower end of the collecting vessel 2 opens. The pipe 24 may be swiveled into position above any of the tanks 18, 20, and 21 by a motor, not shown in the drawing.

When the developing device according to the present invention is in operation, the turntable is rotated by the electric motor 6 at a normal speed of, for example, 50 revolutions per minute. During this time, the printing plate 7 clamped to the turntable 3 is sprayed from the spray nozzle 13 with developer solution, which is pumped from the developer tank 18 and the cup-shaped brushes 8 are lowered onto the surface of the printing plate and rotate thereon in order to provide an intensive surface treatment. The pipe 24 is swiveled into a position above the developer tank 18 so that the developer solution flows back into the tank 18. After completion of the first step of the development process, the gear case 9 with the cup-shaped brushes 8 suspended therefrom is lifted by means of the electric motor 10 so that the brushes no longer contact the surface of the printing plate. Then the speed of the electric motor 6 is increased so that the turntable rotates at 400 revolutions per minute, for example. At the same time, the number of revolutions of the cup-shaped brushes is increased. In this manner, the developer particles adhering to the printing plate and to the cup-shaped brushes are substantially flung off. They run off from the walls of the collecting vessel 2 and are discharged through the pipe 24 into the developer tank 18. Then, the printing plate is rinsed. For this purpose, the pipe 24 is swiveled so that it is positioned above the drain tank 21 and the valve 15 is opened. Rinsing is followed by fixation, as the next process step. For this purpose, the pipe 24 is turned so that it is positioned above the tank 20 and fixing solution is supplied to the spray nozzle 14 by means of the pump 19. During the fixing process, the turntable rotates at normal, i.e., relatively slow, speed. The same applies to the cup-shaped brushes. After completion of the fixing process, the speed of the turntable and of the lifted brushes is again increased, so that residual fixing solution is substantially flung off from the printing plate and from the cup-shaped brushes and flows into the tank 20.

The above-described process steps are advantageously controlled by a time-schedule control of known construction.

The cup-shaped brushes not only can be lifted from the surface of the printing plate after completion of a step of the developing process, in order to allow the solution employed to be centrifuged off at a higher speed, but may remain in the lifted position during a step of the development process, when an intensive mechanical treatment of the surface of the printing plate is not desired. Thus, the developing device according to the invention may be used in various ways.

It will be obvious to those skilled in the art that many modifications may be made within the scope of the present invention without departing from the spirit thereof, and the invention includes all such modifications.

What is claimed is:

1. A developing device for printing plates comprising a developing chamber, rotatable printing plate support means in said chamber, vertically reciprocatable rotatable brush means mounted above said printing plate support means, spray nozzle means directed at said printing plate support means, means for supplying fluid to said spray nozzle means, said brush means being adapted to be lowered onto a surface of a printing plate fixed on the support means for treating said printing plate with fluid from spray nozzle means and said brush means being adapted to be lifted from said surface for centrifuging the fluid from the brushes, and at least one variable-speed electric motor means for actuating said printing plate support means and said brush means, said electric motor means being actuated at a relatively high speed when said brush means is lifted from said surface of said printing plate.

2. A developing device according to claim 1 in which said brush means are cup-shaped brushes.

3. A developing device according to claim 1 in which said developing chamber is closed, at least in the centrifugal area of said printing plate support means and said brush means, said chamber having a tapering bottom with a swivelable knee pipe connected thereto adapted to be positioned over any of a plurality of tanks.

4. A developing device according to claim 3 in which one tank contains developer solution, one tank contains fixing solution, and one tank is a drain tank.

* * * * *